(12) United States Patent
Kageyama et al.

(10) Patent No.: US 12,300,843 B2
(45) Date of Patent: May 13, 2025

(54) POWER STORAGE MODULE

(71) Applicant: Prime Planet Energy & Solutions, Inc., Tokyo (JP)

(72) Inventors: Takatoshi Kageyama, Kakogawa (JP); Yasumasa Kojima, Kasai (JP); Takashi Inamura, Himeji (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 596 days.

(21) Appl. No.: 17/553,533

(22) Filed: Dec. 16, 2021

(65) Prior Publication Data

US 2022/0200090 A1    Jun. 23, 2022

(30) Foreign Application Priority Data

Dec. 21, 2020  (JP) .................. 2020-211179

(51) Int. Cl.
| | |
|---|---|
| *H01M 50/284* | (2021.01) |
| *H01M 50/209* | (2021.01) |
| *H01M 50/258* | (2021.01) |
| *H01M 50/519* | (2021.01) |
| *H05K 1/11* | (2006.01) |

(Continued)

(52) U.S. Cl.
CPC ....... *H01M 50/284* (2021.01); *H01M 50/258* (2021.01); *H05K 1/118* (2013.01); *H05K 5/0256* (2013.01); *H01M 50/209* (2021.01); *H01M 50/519* (2021.01); *H05K 1/189* (2013.01)

(58) Field of Classification Search
CPC ............. H01M 50/284; H01M 50/258; H01M 50/583; H01M 50/209; H01M 50/519; H01M 2200/103; H01M 10/425; H01M 10/426; H05K 1/118; H05K 1/189; H05K 1/0271; H05K 2201/10037

See application file for complete search history.

(56) References Cited

U.S. PATENT DOCUMENTS 6,472,607 B1    10/2002  Someya et al.
9,270,052 B1 *   2/2016  Martin .............. H01R 13/6315
(Continued)

FOREIGN PATENT DOCUMENTS

CN         1268862 A    10/2000
CN       201994384 U     9/2011
(Continued)

*Primary Examiner* — Matthew W Van Oudenaren
(74) *Attorney, Agent, or Firm* — HAUPTMAN HAM, LLP

(57) ABSTRACT

A power storage module includes: a stack of a plurality of power storage cells; a resin plate placed on the stack of the plurality of power storage cells; a flexible printed circuit board placed on the resin plate and having an electric circuit electrically connected to the plurality of power storage cells; and an element provided on the electric circuit. The flexible printed circuit board is fixed to the resin plate at a fixation position including a first fixation portion and a second fixation portion. The first fixation portion and the second fixation portion are separated from each other by a first distance (L1) along the stacking direction, and the element is provided at a position separated from the first fixation portion or the second fixation portion by a second distance (L2) along the stacking direction, the second distance (L2) being less than or equal to ⅓ of the first distance (L1).

8 Claims, 7 Drawing Sheets

(51) Int. Cl.
*H05K 1/18* (2006.01)
*H05K 5/02* (2006.01)

(56) References Cited

U.S. PATENT DOCUMENTS

| | | | |
|---|---|---|---|
| 2002/0057556 A1* | 5/2002 | Mizusaki | H05K 7/142 |
| | | | 361/752 |
| 2018/0198110 A1* | 7/2018 | Zeng | H02H 3/08 |
| 2019/0245185 A1 | 8/2019 | Ishihara | |
| 2019/0386282 A1* | 12/2019 | Nakayama | H01M 50/519 |
| 2022/0077536 A1 | 3/2022 | Yamada et al. | |

FOREIGN PATENT DOCUMENTS

| | | | |
|---|---|---|---|
| CN | 109417150 A | | 3/2019 |
| JP | H05031122 U | | 4/1993 |
| JP | H1081007 | * | 3/1998 |
| JP | 2011166048 | * | 8/2011 |
| JP | 2013-105571 A | | 5/2013 |
| JP | 201933090 A | | 2/2019 |
| JP | 2020-202060 A | | 12/2020 |
| KR | 1020190027096 A | | 3/2019 |
| WO | 2020054305 A1 | | 3/2020 |

\* cited by examiner

POWER STORAGE MODULE

This nonprovisional application is based on Japanese Patent Application No. 2020-211179 filed on Dec. 21, 2020, with the Japan Patent Office, the entire contents of which are hereby incorporated by reference.

BACKGROUND OF THE INVENTION

Field of the Invention

The present technology relates to a power storage module.

Description of the Background Art

A wiring module, which employs a flexible printed circuit board, for a power storage device has been conventionally known. For example, Japanese Patent Laying-Open No. 2019-33090 (PTL 1) discloses a configuration in which a current restriction element is connected in series at a portion of a voltage detection line provided on a flexible printed circuit board.

In the wiring module described in PTL 1, it is important to suppress an excessive increase in stress at the element provided on the flexible printed circuit board. However, the conventional wiring module does not necessarily include a sufficient configuration in view of the above.

SUMMARY OF THE INVENTION

An object of the present technology is to provide a power storage module in which stress is reduced at an element provided on a flexible printed circuit board and at a solder-connected portion thereof.

A power storage module according to the present technology includes: a stack in which a plurality of power storage cells are stacked in a stacking direction; a resin plate placed on the stack of the plurality of power storage cells; a flexible printed circuit board placed on the resin plate and having an electric circuit electrically connected to the plurality of power storage cells; and an element provided on the electric circuit. The flexible printed circuit board is fixed to the resin plate at a fixation position including a first fixation portion and a second fixation portion adjacent to each other.

In one aspect, the first fixation portion and the second fixation portion are separated from each other by a first distance (L1) along the stacking direction, and the element is provided at a position separated from the first fixation portion or the second fixation portion by a second distance (L2) along the stacking direction, the second distance (L2) being less than or equal to ⅓ of the first distance (L1).

In another aspect, the element is provided at a position separated from the first fixation portion or the second fixation portion along the stacking direction by a distance that is less than or equal to a half of a distance along the stacking direction to the first fixation portion or the second fixation portion from a maximum amplitude point between the first fixation portion and the second fixation portion when the flexible printed circuit board fixed at the first fixation portion and the second fixation portion is vibrated in a first-order vibration mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
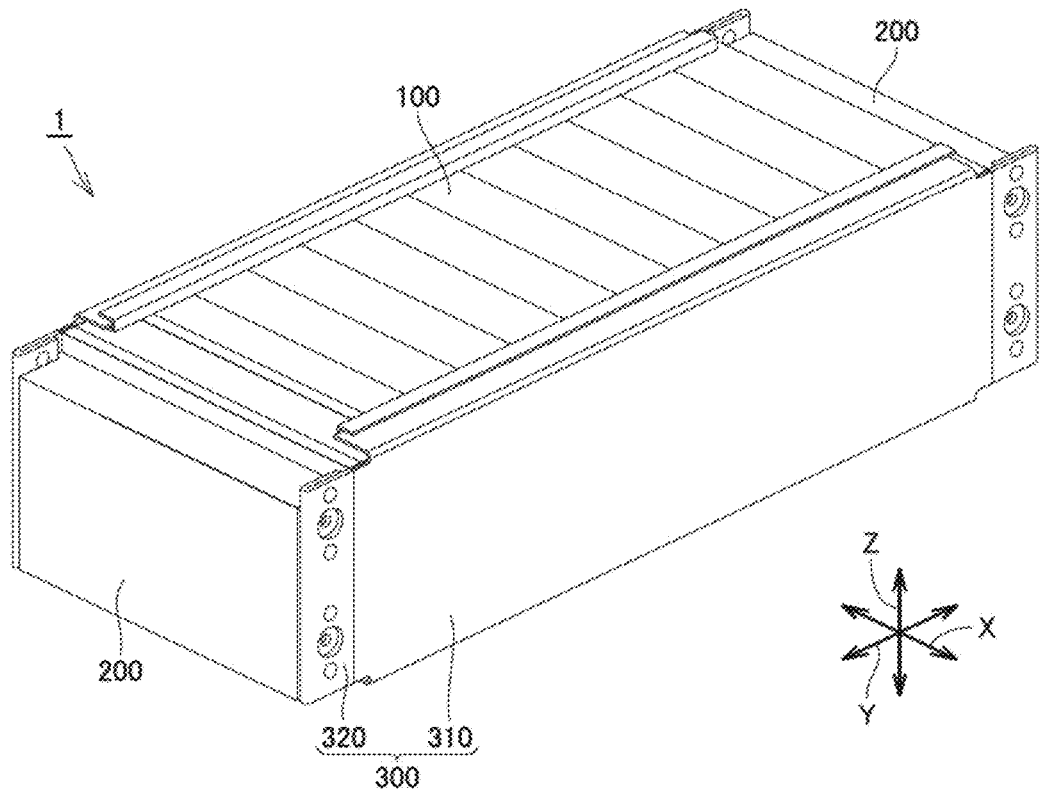
FIG. 1 is a diagram showing a basic configuration of a battery pack.

Hereinafter, embodiments of the present technology will be described. It should be noted that the same or corresponding portions are denoted by the same reference characters, and may not be described repeatedly.

It should be noted that in the embodiments described below, when reference is made to number, amount, and the like, the scope of the present technology is not necessarily limited to the number, amount, and the like unless otherwise stated particularly. Further, in the embodiments described below, each component is not necessarily essential to the present technology unless otherwise stated particularly.

It should be noted that in the present specification, the terms "comprise", "include", and "have" are open-end terms. That is, when a certain configuration is included, a configuration other than the foregoing configuration may or may not be included. Further, the present technology is not limited to one that necessarily exhibits all the functions and effects stated in the present embodiment.

In the present specification, the term "battery" is not limited to a lithium ion battery, and may include another battery such as a nickel-metal hydride battery. In the present specification, the term "electrode" may collectively represent a positive electrode and a negative electrode. Further, the term "electrode plate" may collectively represent a positive electrode plate and a negative electrode plate.

In the present specification, the "power storage cell" or the "power storage module" is not limited to a battery cell or a battery module, and may include a capacitor cell or a capacitor module.

Figure 2:
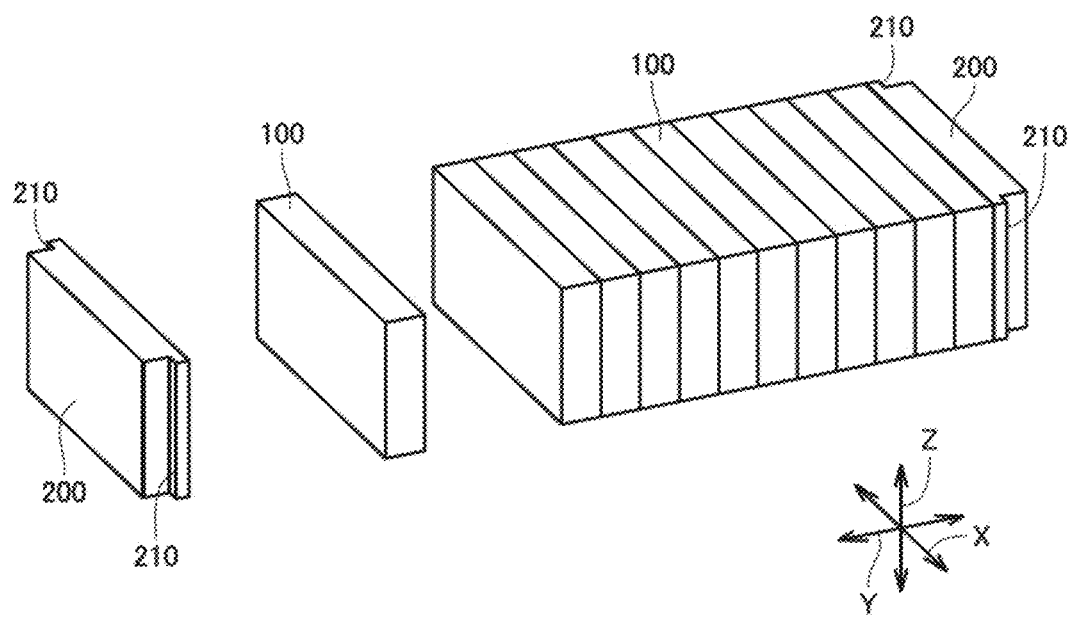
FIG. 2 is a diagram showing battery cells and end plates in the battery pack shown in FIG. 1.

FIG. 1 is a diagram showing a basic configuration of a battery pack 1. FIG. 2 is a diagram showing battery cells 100 and end plates 200 included in battery pack 1.

As shown in FIGS. 1 and 2, battery pack 1, which serves as an exemplary "power storage module", includes battery cells 100, end plates 200, and a restraint member 300.

The plurality of battery cells 100 are provided side by side in a Y axis direction (arrangement direction). Thus, a stack of battery cells 100 is formed. Each of battery cells 100 includes an electrode terminal 110. A separator (not shown) is interposed between the plurality of battery cells 100. The plurality of battery cells 100, which are sandwiched between two end plates 200, are pressed by end plates 200, and are therefore restrained between two end plates 200.

End plates 200 are disposed beside both ends of battery pack 1 in the Y axis direction. Each of end plates 200 is fixed to a base such as a case that accommodates battery pack 1. Stepped portions 210 are formed at both ends of end plate 200 in an X axis direction.

Restraint member 300 connects two end plates 200 to each other. Restraint member 300 is attached to stepped portions 210 formed on two end plates 200.

Restraint member 300 is engaged with end plates 200 with compression force in the Y axis direction being exerted to the stack of the plurality of battery cells 100 and end plates 200, and then the compression force is released, with the result that tensile force acts on restraint member 300 that connects two end plates 200 to each other. As a reaction thereto, restraint member 300 presses two end plates 200 in directions of bringing them closer to each other.

Restraint member 300 includes a first member 310 and a second member 320. First member 310 and second member 320 are coupled to each other by butt welding, for example. Tip surfaces formed by folding second member 320 are brought into abutment with stepped portions 210 of end plate 200 in the Y axis direction.

Figure 3:
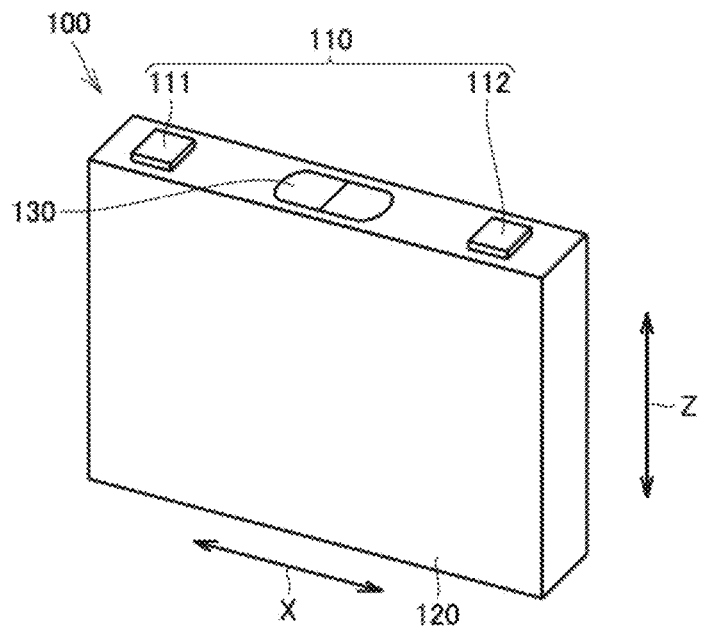
FIG. 3 is a diagram showing a battery cell in the battery pack shown in FIG. 1.

FIG. 3 is a diagram showing battery cell 100 in battery pack 1. As shown in FIG. 3, battery cell 100 includes electrode terminal 110, a housing 120, and a gas discharge valve 130.

Electrode terminal 110 includes a positive electrode terminal 111 and a negative electrode terminal 112. Electrode terminal 110 is formed on housing 120. Housing 120 is formed to have a substantially rectangular parallelepiped shape. An electrode assembly (not shown) and an electrolyte solution (not shown) are accommodated in housing 120. Gas discharge valve 130 is fractured when pressure inside housing 120 becomes equal to or more than a predetermined value. Thus, gas in housing 120 is discharged to the outside of housing 120.

Figure 4:
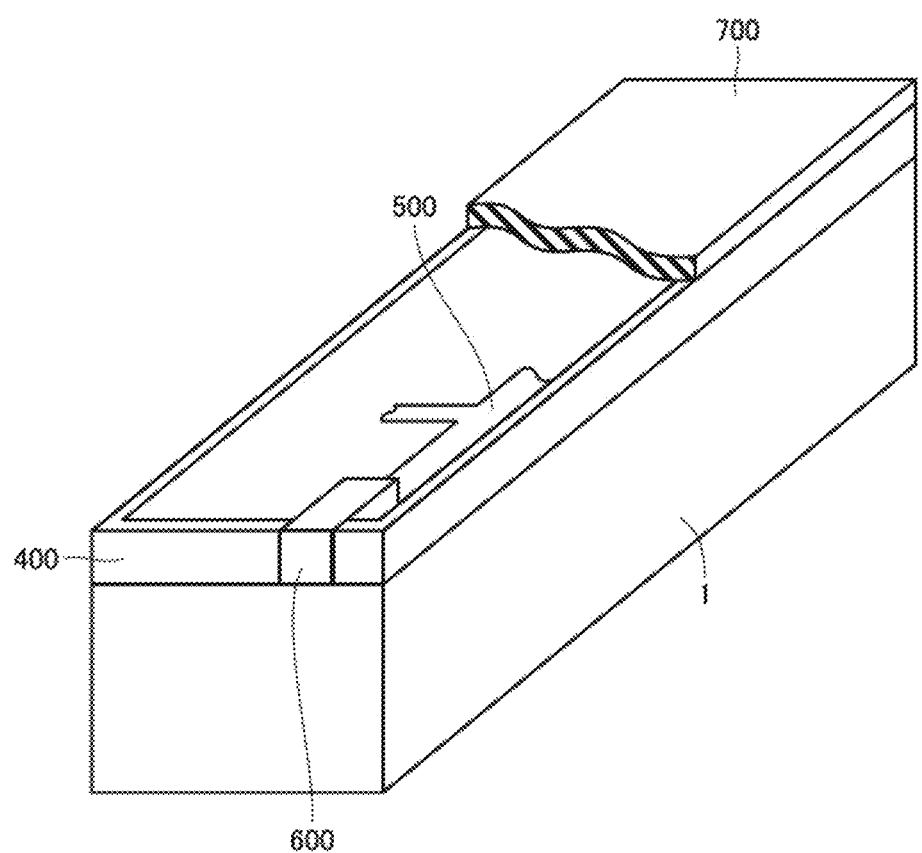
FIG. 4 is a perspective view showing a state in which a wiring module is provided on the battery pack.

FIG. 4 is a perspective view showing a state in which a wiring module is provided on battery pack 1. As shown in FIG. 4, a plate member 400 is placed on battery pack 1, and a wiring member 500 is provided on plate member 400. Wiring member 500 can be electrically connected to an external device via a connector 600. A cover member 700 is provided on plate member 400 so as to cover wiring member 500.

Figure 5:
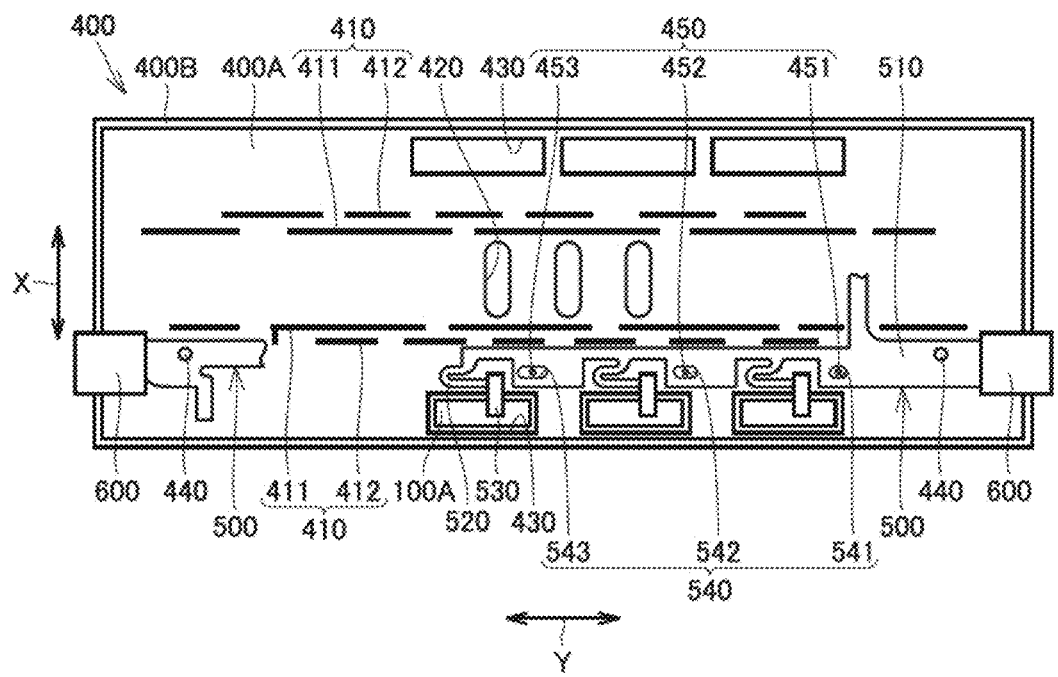
FIG. 5 is a schematic top view of the wiring module placed on the battery pack.

FIG. 5 is a schematic top view of the wiring module placed on battery pack 1. As shown in FIG. 5, the wiring module includes plate member 400, wiring member 500, and connector 600.

Plate member 400 (bus bar plate) is a resin plate having insulation property and heat resistance. Plate member 400 has: a bottom surface portion 400A; and a side surface portion 400B formed to extend upward from bottom surface portion 400A in a Z axis direction.

Plate member 400 is provided with a wall portion 410, openings 420, 430, and protrusions 440, 450.

Wall portion 410 is formed to extend upward from bottom surface portion 400A of plate member 400 in the Z axis direction. Wall portion 410 includes: a first wall portion 411 formed on the center side in the X axis direction; and a second wall portion 412 provided on the outer side in the X axis direction in parallel with first wall portion 411. Each of first wall portion 411 and second wall portion 412 is formed to extend discontinuously in the Y axis direction.

Each of first wall portion 411 and second wall portion 412 can serve as a protection wall that prevents sparking generated in plate member 400 from being directly exposed to outside while securing a path for discharging, to the outside of the battery pack, the gas discharged from housing 120 of battery cell 100.

Each of openings 420 is located above gas discharge valve 130 of battery cell 100. Each of openings 430 is located above electrode terminal 110 of battery cell 100.

Each of protrusions 440 (projections) extends through wiring member 500 in the vicinity of connector 600. Thus, connector 600 is positioned.

Protrusions 450 include a first protrusion 451, a second protrusion 452, and a third protrusion 453 in the order from the side closest to connector 600. First protrusion 451, second protrusion 452, and third protrusion 453 are formed side by side in the Y axis direction. Each of first protrusion 451, second protrusion 452, and third protrusion 453 extends through wiring member 500. The number of protrusions 450 can be appropriately changed.

Wiring member 500 includes a flexible printed circuit board 510, displacement absorbing portions 520, bus bar joining portions 530, and elongated holes 540.

Flexible printed circuit board 510 is a board in which an electric circuit is formed on a base member including a base film having an insulation property and a conductive metal foil. The base film is composed of, for example, polyimide or the like. The conductive metal foil is composed of, for example, a copper foil or the like. Flexible printed circuit board 510 has flexibility and has such a characteristic that the electric characteristics of flexible printed circuit board 510 are maintained even when deformed.

Each of displacement absorbing portions 520 is formed by forming a portion of flexible printed circuit board 510 into a substantially U-shape so as to facilitate deformation. Displacement absorbing portion 520 is connected to bus bar joining portion 530. Bus bar joining portion 530 is joined to bus bar 100A that couples electrode terminals 110 of the plurality of battery cells 100. Thus, the electric circuit provided on flexible printed circuit board 510 and battery pack 1 are electrically connected to each other. With displacement absorbing portion 520, displacements (in the X axis direction, the Y axis direction, and the Z axis direction) of bus bar joining portion 530 can be absorbed.

Elongated holes 540 include a first elongated hole 541, a second elongated hole 542, and a third elongated hole 543 in the order from the side closest to connector 600. First elongated hole 541, second elongated hole 542, and third elongated hole 543 are formed side by side in the Y axis direction. The number of elongated holes 540 can be appropriately changed.

First protrusion 451 is inserted into first elongated hole 541. Second protrusion 452 is inserted into second elongated hole 542. Third protrusion 453 is inserted into third elongated hole 543. Second elongated hole 542 is longer than first elongated hole 541 in the Y axis direction, and third elongated hole 543 is longer than second elongated hole 542 in the Y axis direction. That is, the lengths of elongated holes 540 in the Y axis direction are longer in the direction further away from connector 600. In this way, positioning can be readily performed when placing wiring member 500 and connector 600 on plate member 400.

Connector 600 is fixed to flexible printed circuit board 510. The electric circuit in flexible printed circuit board 510 and an external electric device can be electrically connected to each other via connector 600.

Figure 6:
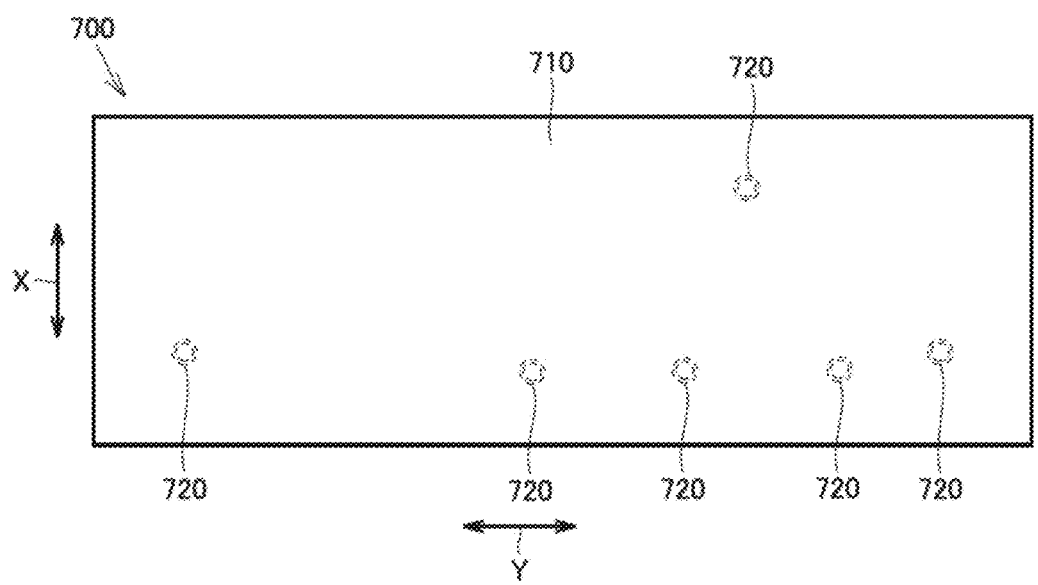
FIG. 6 is a schematic top view of a cover member that covers the wiring module.

FIG. 6 is a schematic top view of cover member 700 (bus bar cover) that covers the wiring module shown in FIG. 5. Cover member 700 is provided on plate member 400 so as to cover flexible printed circuit board 510.

As shown in FIG. 6, cover member 700 includes a main body 710 and tubular protrusions 720. Each of tubular protrusions 720 protrudes toward flexible printed circuit board 510 on plate member 400. Tubular protrusions 720 and protrusions 440, 450 are provided on both sides beside openings 420 in the X axis direction. Further, the plurality of tubular protrusions 720 and the plurality of protrusions 440, 450 are provided along the Y axis direction (stacking direction of battery cells 100).

Figure 7:
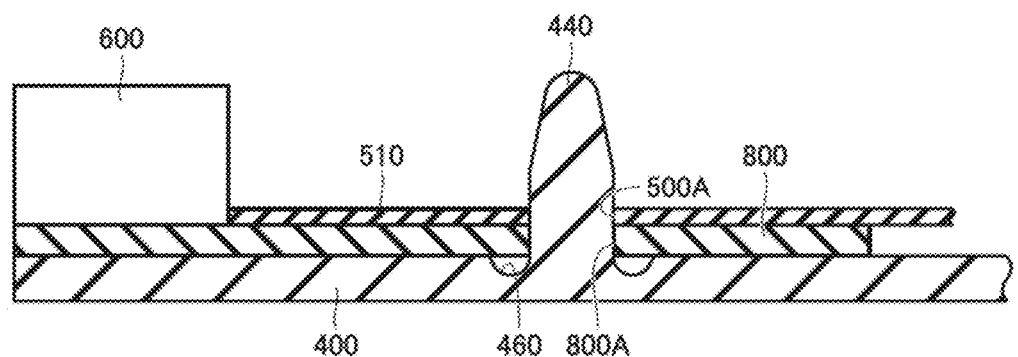
FIG. 7 is a cross sectional view of the vicinity of a connector in the wiring module.

FIG. 7 is a cross sectional view of the vicinity of connector 600 in the wiring module. As shown in FIG. 7, a substrate 800 that supports flexible printed circuit board 510 and connector 600 is provided. Substrate 800 is fixed to plate member 400. Substrate 800 is composed of, for example, a glass epoxy resin or the like. Substrate 800 is composed of a material harder than that of flexible printed circuit board 510.

Protrusion 440 of plate member 400 extends through hole portion 800A of substrate 800 and hole portion 500A of flexible printed circuit board 510. That is, plate member 400 and substrate 800 are engaged with each other by protrusion 440 of plate member 400 and hole portion 800A of substrate 800. Thus, substrate 800 and wiring member 500 can be positioned with respect to plate member 400.

Further, a groove portion 460 having an annular shape is formed in plate member 400 at the root portion of protrusion 440. Groove portion 460 has a curved contour. Accordingly, stress concentration around groove portion 460 can be relaxed.

When protrusion 440 is formed at plate member 400 by resin molding, the root portion of protrusion 440 needs to have a portion having a curved shape (shape with a curvature) for the sake of manufacturing. If the curved shape (shape with a curvature) is provided without forming groove portion 460, the diameter of the root portion of protrusion 440 becomes large, with the result that hole portion 500A of flexible printed circuit board 510 and hole portion 800A of substrate 800 have to be slightly larger. When hole portion 500A of flexible printed circuit board 510 is large, an area in which the electric circuit can be formed in flexible printed circuit board 510 is reduced. When hole portion 800A of substrate 800 is large, precision in positioning connector 600 with substrate 800 being interposed is reduced.

On the other hand, according to the structure of the present embodiment, since groove portion 460 having the curved contour is formed in bottom surface portion 400A of plate member 400 at the root portion of protrusion 440, hole portion 500A of flexible printed circuit board 510 and hole portion 800A of substrate 800 can be suppressed from being large while relaxing stress concentration around groove portion 460. As a result, the area in which the electric circuit can be formed in flexible printed circuit board 510 can be suppressed from being reduced and the precision in positioning connector 600 with substrate 800 being interposed can be suppressed from being reduced. As a result, downsizing of the module as a whole can be attained, and the power storage module in which connector 600 is positioned with high precision can be obtained.

Figure 8:
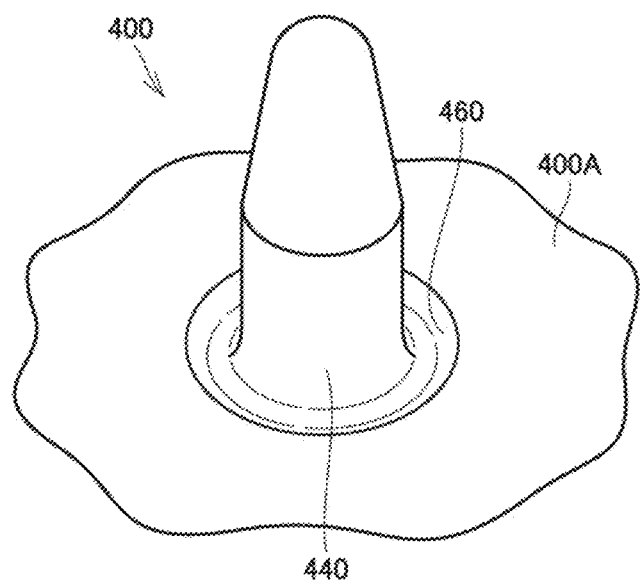
FIG. 8 is a perspective view showing the vicinity of a projection provided in a plate member of the wiring module.

FIG. 8 is a perspective view showing the vicinity of protrusion 440 of plate member 400. As shown in FIG. 8, groove portion 460 is formed to have an annular shape so as to surround the entire periphery of the root portion of protrusion 440.

Figure 9:
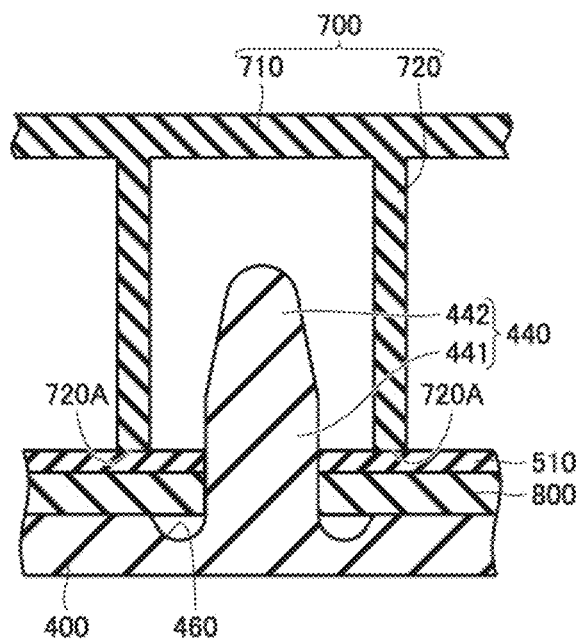
FIG. 9 is a cross sectional view showing a state in which the cover member is attached to the wiring module (the vicinity of the projection shown in FIG. 8).

FIG. 9 is a cross sectional view of the vicinity of protrusion 440 when cover member 700 is attached to the wiring module. As shown in FIG. 9, tubular protrusion 720 of cover member 700 is in abutment with flexible printed circuit board 510. Thus, wiring member 500 and substrate 800 are pressed against plate member 400 and are therefore fixed. On this occasion, protrusion 440 of plate member 400 is accommodated in the inner periphery of tubular protrusion 720. Abutment surface 720A of tubular protrusion 720 is located on the outer peripheral side with respect to groove portion 460 at the root portion of protrusion 440. According to the structure of the present embodiment, flexible printed circuit board 510 can be precisely positioned and can be stably fixed.

Protrusion 440 includes a first portion 441 and a second portion 442, first portion 441 having a side surface perpendicular to the bottom surface of plate member 400, second portion 442 being provided at a position away from the bottom surface of plate member 400 with respect to first portion 441, second portion 442 having a diameter that is reduced in a direction away from the bottom surface of plate member 400. Tubular protrusion 720 extends beyond second portion 442 to reach a position outward in a radial direction of first portion 441.

It should be noted that each of FIG. 9 as well as FIGS. 10, 11 and 13 described below shows protrusion 440; however, tubular protrusion 720 having the same structure is also provided above each of protrusions 450 (first protrusion 451, second protrusion 452, and third protrusion 453).

Figure 10:
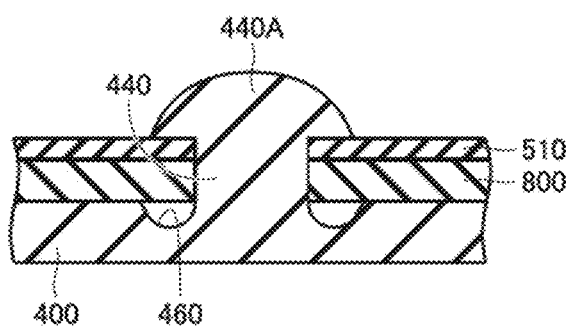
FIG. 10 is a cross sectional view of the vicinity of a projection according to a modification.

FIG. 10 is a cross sectional view of the vicinity of a protrusion 440 according to a modification. In the example shown in FIG. 10, a swaged portion 440A is formed at the tip of protrusion 440. Swaged portion 440A is formed by, for example, heat swaging. Flexible printed circuit board 510 is fixed to plate member 400 by swaged portion 440A. In the example of FIG. 10, tubular protrusion 720 of cover member 700 is not necessarily required.

Figure 11:
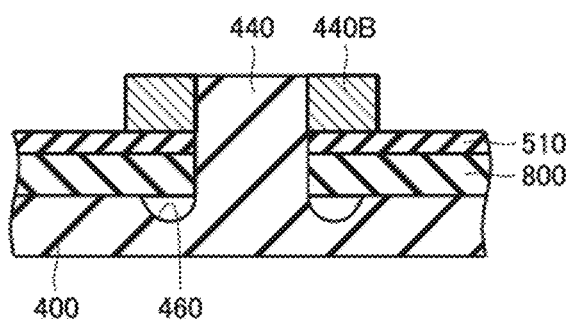
FIG. 11 is a cross sectional view of the vicinity of a projection according to another modification.

FIG. 11 is a cross sectional view of the vicinity of a protrusion 440 according to another modification. In the example shown in FIG. 11, a fixation member 440B is provided on the outer peripheral portion of protrusion 440. Fixation member 440B fixes flexible printed circuit board 510 to plate member 400. Also in the example of FIG. 11, tubular protrusion 720 of cover member 700 is not necessarily required.

Figure 12:
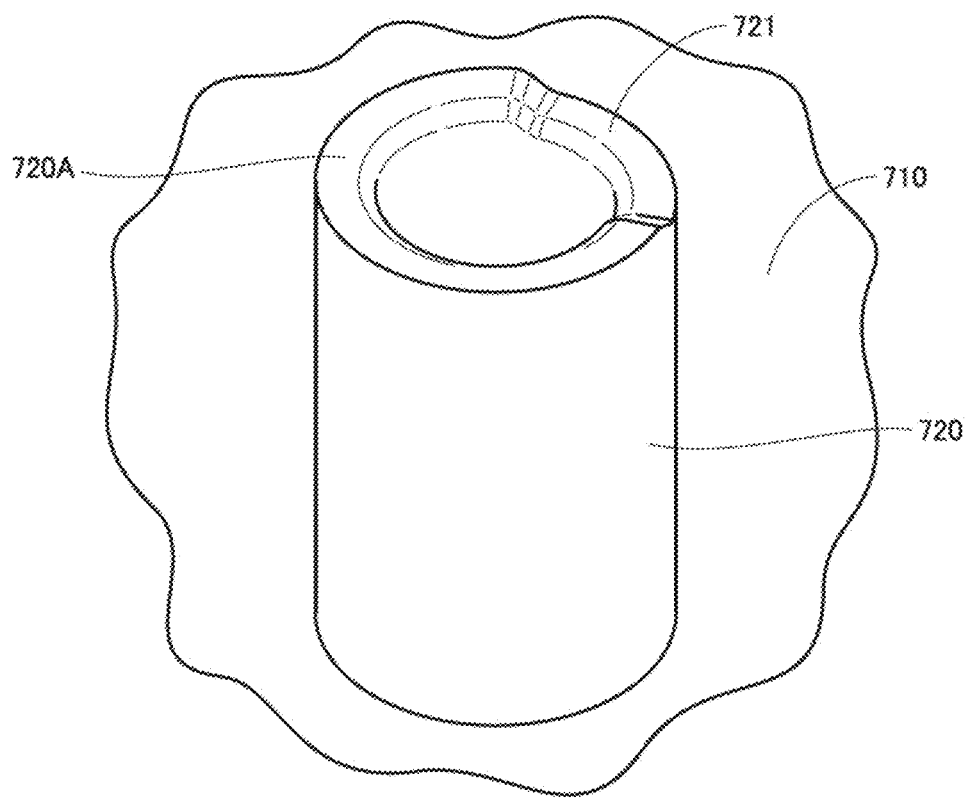
FIG. 12 is a perspective view showing a tubular protrusion of the cover member.

FIG. 12 is a perspective view showing the tubular protrusion of the cover member. As shown in FIG. 12, the tip of tubular protrusion 720 has: abutment surface 720A (abutment portion) in abutment with flexible printed circuit board 510; and a notch portion 721 (non-abutment portion) disposed beside the abutment portion in the peripheral direction of tubular protrusion 720 and separated from flexible printed circuit board 510.

Figure 13:
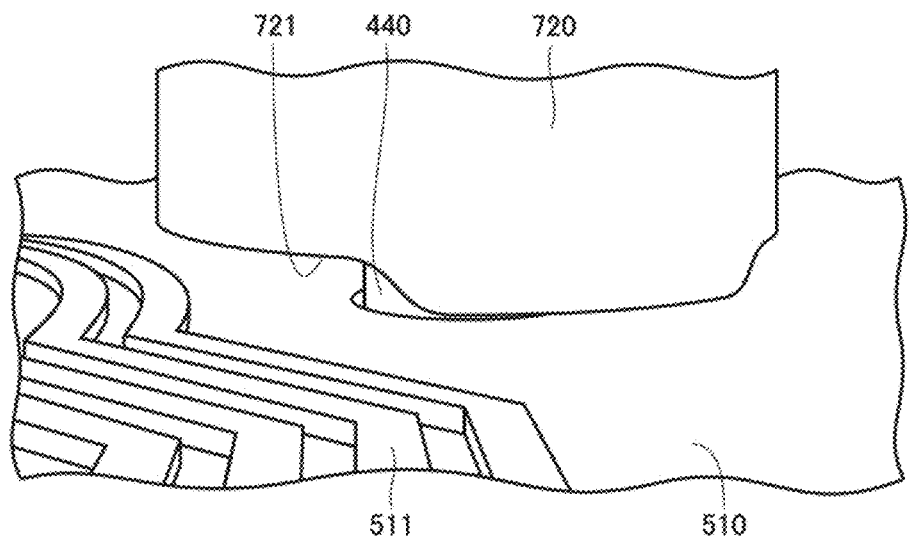
FIG. 13 is an enlarged view showing an abutment portion of the tubular protrusion in abutment with a flexible printed circuit board.

FIG. 13 is an enlarged view showing the abutment portion of the tubular protrusion in abutment with the flexible printed circuit board. As shown in FIG. 13, electric circuit 511 is formed on flexible printed circuit board 510. Tubular protrusion 720 is in abutment with flexible printed circuit board 510 at a position to avoid electric circuit 511. Specifically, electric circuit 511 on flexible printed circuit board 510 is provided on the outer peripheral side with respect to abutment surface 720A of tubular protrusion 720. Therefore, electric circuit 511 on flexible printed circuit board 510 is suppressed from being damaged due to the abutment of tubular protrusion 720. At a portion of flexible printed circuit board 510 at which electric circuit 511 reaches a position on the inner peripheral side with respect to abutment surface 720A of tubular protrusion 720, electric circuit 511 is suppressed from being damaged because notch portion 721 is provided at the tip portion of tubular protrusion 720.

Figure 14:
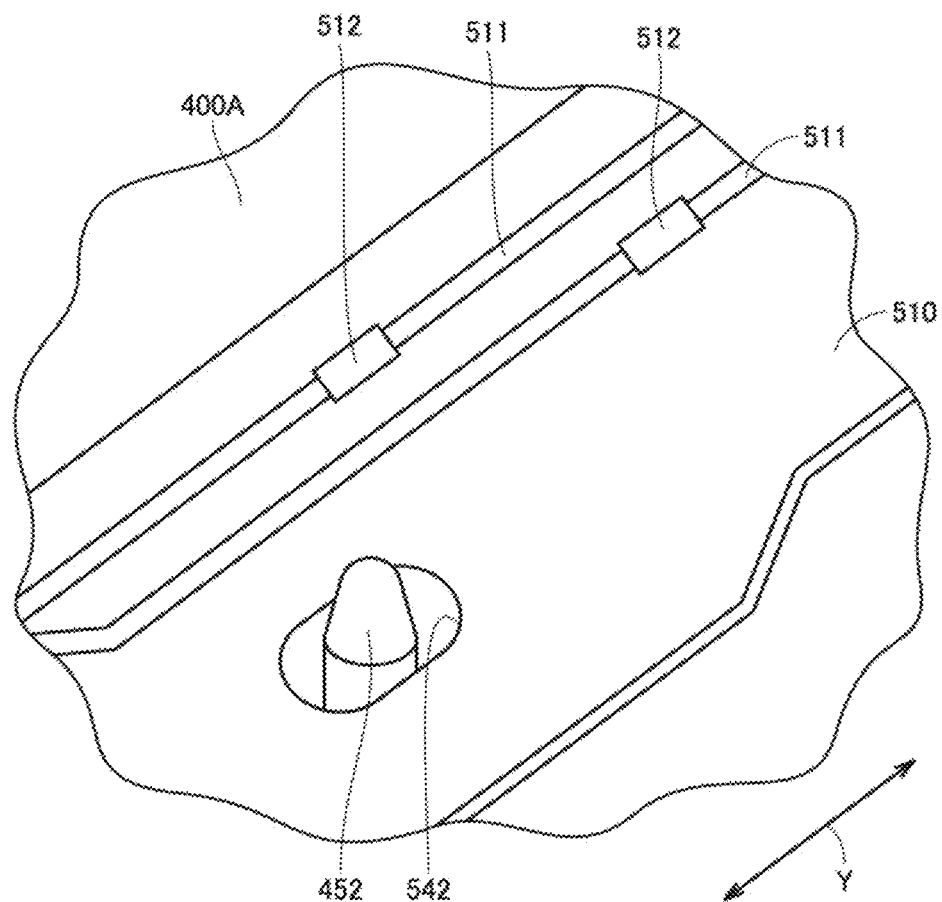
FIG. 14 is a diagram showing an electric circuit and an element provided in the vicinity of a fixation portion.

FIG. 14 is a diagram showing electric circuit 511 and an element 512 provided in the vicinity of second protrusion 452. As shown in FIG. 14, electric circuit 511 has a portion extending in the Y axis direction. Element 512 is provided on electric circuit 511 extending in the Y axis direction, and is connected thereto by soldering. A position at which element 512 is provided can be appropriately changed on electric circuit 511, and is not limited to the portion extending in the Y axis direction. Element 512 is, for example, a fuse element or a resistance element, but element 512 is not limited thereto.

Figure 15:
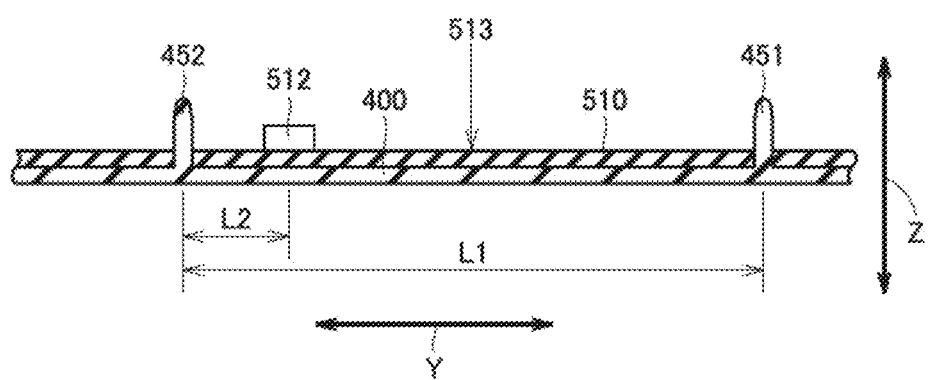
FIG. 15 is a diagram for illustrating a position at which the element is provided.

Next, a position at which element 512 is provided will be described with reference to FIG. 15. Flexible printed circuit board 510 is fixed to plate member 400 at first protrusion 451 (first fixation portion) and second protrusion 452 (second fixation portion). Flexible printed circuit board 510 can be fixed to plate member 400 at a portion other than first protrusion 451 and second protrusion 452. As shown in FIG. 15, in the cross section along the Y axis direction, no fixation portion for flexible printed circuit board 510 exists between first protrusion 451 and second protrusion 452. That is, first protrusion 451 and second protrusion 452 are fixation portions adjacent to each other.

First protrusion 451 and second protrusion 452 are separated from each other by L1 (first distance) along the Y axis direction. In the example of FIG. 15, element 512 is provided in the vicinity of second protrusion 452. Second protrusion 452 and element 512 are separated from each other by L2 (second distance) along the Y axis direction.

L2 (second distance) is about less than or equal to ⅓ of the distance of L1 (first distance), or is preferably about less than or equal to ¼ of the distance of L1 (first distance). In other words, element 512 is preferably provided at a position separated from first protrusion 451 or second protrusion 452 along the Y axis direction by a distance that is less than or equal to the half of a distance along the Y axis direction to first protrusion 451 or second protrusion 452 from a maximum amplitude point 513 when flexible printed circuit board 510 fixed at first protrusion 451 (first fixation portion) and second protrusion 452 (second fixation portion) is vibrated in a first-order vibration mode. It should be noted that in the example of FIG. 15, maximum amplitude point 513 is located at the center of the interval between first protrusion 451 and second protrusion 452; however, the position of maximum amplitude point 513 can be varied depending on the shape of flexible printed circuit board 510.

By providing element 512 in the vicinity of the fixation portion for flexible printed circuit board 510 in this way, even when flexible printed circuit board 510 is vibrated in the Z axis direction due to external vibration, an excessive increase in stress can be suppressed at element 512 provided on flexible printed circuit board 510 and a solder-connected portion thereof. That is, according to the structure of the present embodiment, stress can be reduced at element 512 and the solder-connected portion in the event of vibration of flexible printed circuit board 510.

Although the embodiments of the present invention have been described and illustrated in detail, it is clearly understood that the same is by way of illustration and example only and is not to be taken by way of limitation, the scope of the present invention being interpreted by the terms of the appended claims.

What is claimed is:

1. A power storage module comprising:
a stack in which a plurality of power storage cells are stacked in a stacking direction;
a resin plate placed on the stack of the plurality of power storage cells in a second direction orthogonal to the stacking direction;
a flexible printed circuit board placed on the resin plate in the second direction and having an electric circuit electrically connected to the plurality of power storage cells; and
an element provided on the electric circuit, wherein
the flexible printed circuit board is fixed to the resin plate at a fixation position including a first fixation portion and a second fixation portion adjacent to each other,
each of the first fixation portion and the second fixation portion fixes the flexible printed circuit board to the resin plate in the second direction,
in the first fixation portion, the resin plate has a first protrusion, and in the second fixation portion, the resin plate has a second protrusion, the first protrusion and the second protrusion protruding in the second direction,
the first protrusion is in a first elongated hole, the second protrusion is in a second elongated hole, and the first elongated hole and the second elongated hole are in the flexible printed circuit board,
an inner diameter of the first elongated hole in the stacking direction is larger than an inner diameter of the first elongated hole in a third direction which is orthogonal to the stacking direction and the second direction,
an inner diameter of the second elongated hole in the stacking direction is larger than an inner diameter of the second elongated hole in the third direction,
the inner diameter of the first elongated hole in the stacking direction is larger than a diameter of the first protrusion in the stacking direction,
the inner diameter of the second elongated hole in the stacking direction is larger than a diameter of the second protrusion in the stacking direction,
the first fixation portion and the second fixation portion are separated from each other by a first distance (L1) along the stacking direction, and
the element is provided at a position separated from the first fixation portion or the second fixation portion by a second distance (L2) along the stacking direction, the second distance (L2) being less than or equal to ⅓ of the first distance (L1).

2. The power storage module according to claim 1, wherein the second distance (L2) is less than or equal to ¼ of the first distance (L1).

3. The power storage module according to claim 1, further comprising a cover member provided on the resin plate so as to cover the flexible printed circuit board, wherein
the resin plate includes a projection that extends through the flexible printed circuit board, the cover member includes a tubular protrusion that protrudes toward the flexible printed circuit board on the resin plate, the projection is accommodated in an inner periphery of the tubular protrusion, and each of the first fixation portion and the second fixation portion is constituted of the tubular protrusion.

4. The power storage module according to claim 3, wherein the tubular protrusion includes a tip portion, and the tip portion has an abutment portion in abutment with the flexible printed circuit board, and a non-abutment portion disposed beside the abutment portion in a peripheral direction of the tubular protrusion and separated from the flexible printed circuit board.

5. The power storage module according to claim 4, wherein the non-abutment portion is constituted of a notch portion provided at the tip portion of the tubular protrusion.

6. The power storage module according to claim 1, wherein the resin plate includes a projection that extends through the flexible printed circuit board, and the first fixation portion or the second fixation portion is formed by swaging the projection onto the flexible printed circuit board.

7. The power storage module according to claim 1, wherein the resin plate includes a projection that extends through the flexible printed circuit board, the power storage module further comprising a fixation member that is provided on an outer peripheral portion of the projection and that fixes the flexible printed circuit board to the resin plate, wherein the first fixation portion or the second fixation portion is formed by the fixation member.

8. The power storage module according to claim 1, wherein the element is a fuse element or a resistance element.

* * * * *